(12) United States Patent
Pangrle et al.

(10) Patent No.: US 6,361,837 B2
(45) Date of Patent: *Mar. 26, 2002

(54) METHOD AND SYSTEM FOR MODIFYING AND DENSIFYING A POROUS FILM

(75) Inventors: Suzette K. Pangrle; Richard J. Huang, both of Cupertino; Shekhar Pramanick, Fremont, all of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,359

(22) Filed: Jan. 15, 1999

(51) Int. Cl.[7] .............................. B05D 3/06; C08J 7/04; C08J 7/18
(52) U.S. Cl. .................. 427/552; 427/533; 427/504; 427/503; 427/526; 438/781; 438/788; 438/792
(58) Field of Search ................. 427/533, 581, 427/554, 596, 597, 496, 498, 503, 552, 504, 526; 438/798, 778, 780, 781, 788, 792

(56) References Cited

U.S. PATENT DOCUMENTS

| 4,437,139 A | 3/1984 | Howard ................... 427/554 |
| 4,457,950 A | 7/1984 | Fujita ..................... 427/551 |
| 5,003,178 A | 3/1991 | Livesay ................... 250/427 |
| 5,591,285 A | 1/1997 | Afzali-Ardakani et al. . 427/596 |
| 5,609,925 A | 3/1997 | Camilletti et al. .......... 427/503 |
| 5,643,706 A | 7/1997 | Brillson et al. ............ 427/554 |
| 5,736,425 A | 4/1998 | Smith et al. |
| 5,766,697 A | 6/1998 | Sengupta et al. ........... 427/596 |
| 6,042,994 A | 3/2000 | Yang et al. ................ 430/269 |
| 6,054,390 A | 4/2000 | Liu et al. .................. 438/706 |
| 6,080,526 A | 6/2000 | Yang et al. ................ 427/551 |

OTHER PUBLICATIONS

*Hackh's Chemical Dictionary*, J. Orant, ed., McGraw–Hill Book Co., N.Y.—Excerpt p. 728, 1969 No month.
*Hawley's Condensed Chemical Dictionary*, 12th ed, Revised by R. Lewis. Sr., Van Nostrand Reinhold Co., N.Y., Excerpt p. 26, 1993 No month.

(List continued on next page.)

*Primary Examiner*—Marianne Padgett
(74) *Attorney, Agent, or Firm*—Eschweiler & Associates, LLC

(57) ABSTRACT

The invention provides a system and a method for densifying a surface of a porous film. By reducing the porosity of a film, the method yields a densified film that is more impenetrable to subsequent liquid processes. The method comprises the steps of providing a film having an exposed surface. The film can be supported by a semiconductor substrate. When the film is moved to a processing position, a focused source of radiation is created by a beam source. The exposed surface of the film is then irradiated by the beam source at the processing position until a predetermined dielectric constant is achieved. The film or beam source may be rotated, inclined, and/or moved between a variety of positions to ensure that the exposed surface of the film is irradiated evenly.

3 Claims, 3 Drawing Sheets

OTHER PUBLICATIONS

Integration of Low–K Xerogel summarized by Denis Endisch, taken from "Integration of Ultra–Low–KXerogel Gapfill Dielectric for High Performance Sub–0.18 um Interconnects", by R. S. List, C. Jin, S. W. Russell, S. Yamanaka, L. Olsen, L. Le, L. M. Ting and R. H. Havemann, Semiconductor Process and Device Center, Texas Instruments, presented a the VLSI Symposium in Kyoto in Jun., 1997, one page.

"Deposition and Characterization of Porous Silica Xerogel Films", Changming Jin, Scott List, Stacey Yamanaka, Wei William Lee, Kelly Taylor, Wei–Yung Hsu, Leif Olsen, J.D. Luttmer, Robert Havemann, Douglas Smith, Teresa Ramos and Alok Maskara, Date Unknown, 6 pages.

"Integration of Ultra–Low–K Xerogel Dielectric for High Performance Sub–0.18 um Interconnects", R.S. List, C. Jin, S.W. Russell, S. Yamanaka, L. Olsen, L. Le, L. M. Ting and R.H. Havenmann, Date Unknown, 2 pages. Probly shortly after Dec. 1996.

"Semiconductor Parts", Kyocera, Product Information, taken from the Internat at http://www.kyocera.co.jp/noframe/products/semicon/indes.html. Aug. 7, 1998, 2 pages.

"One in a series of articles in which Channel spotlights technologies in transition Miniperspective: Emerging Metallization for the Sub–Quarter–Micron Era", Channel Magazine taken from the Internet at http://www.emi.org/Channel/1997/oct/features/growth.html, Aug. 7, 1998, 3 pages.

"Electron Beam Curing Tools", Allied Signal Product Bulletin, Date Unknown, 4 pages.

"Preparation of Low–Density Xerogels at Ambient Pressure for Low K Dielectrics", D.M. Smith, J. Anderson, C.C. Cho, G.P. Johnston and S.P. Jeng, Spring 1995, MRS Symposium, 6 pages.

"Damascene Integration of Copper and Ultra–Low–k Xerogel for High Performance Interconnects", E.M. Zielinski, S.W. Russel, R.S. List, A.M. Wilson, C. Jin, K.J. Newton, J.P. Lu, T. Hurd, W.Y. Hsu, V. Cordasco, M. Gopikanth, V. Korthuis, W. Lee, G. Cerny, N.M. Russell, P.B. Smith, S. O'Brien and R.H. Havemann, IEDM, 1997, 3 pages. No month.

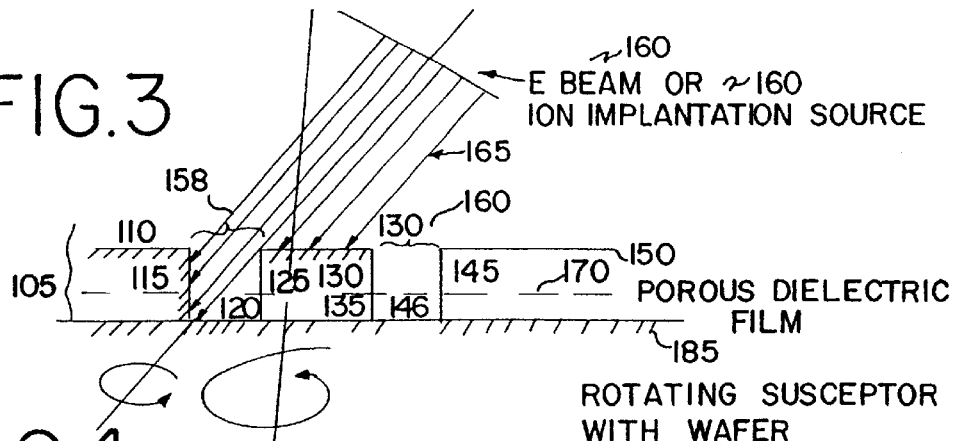
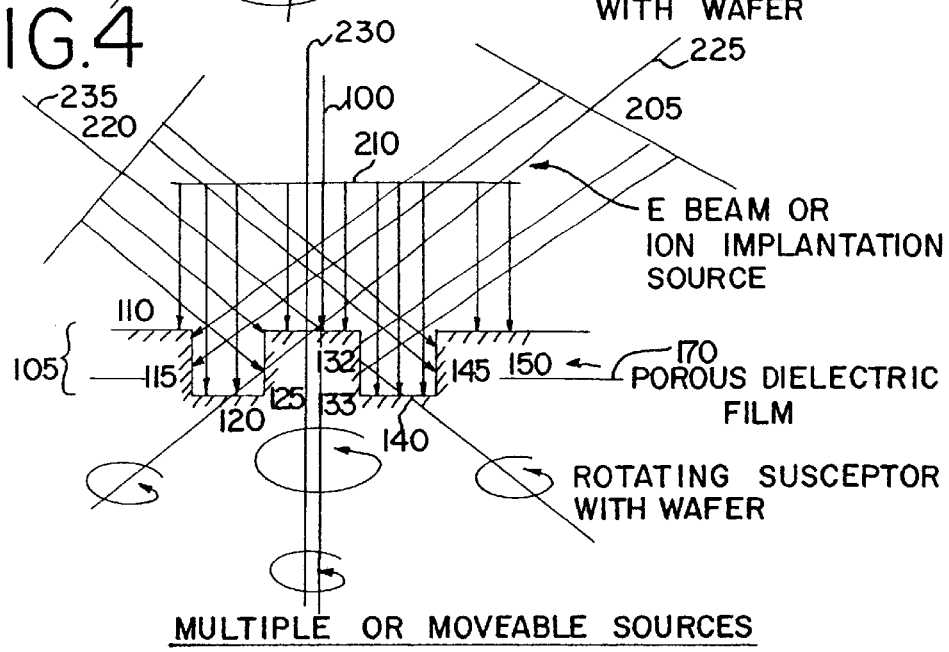
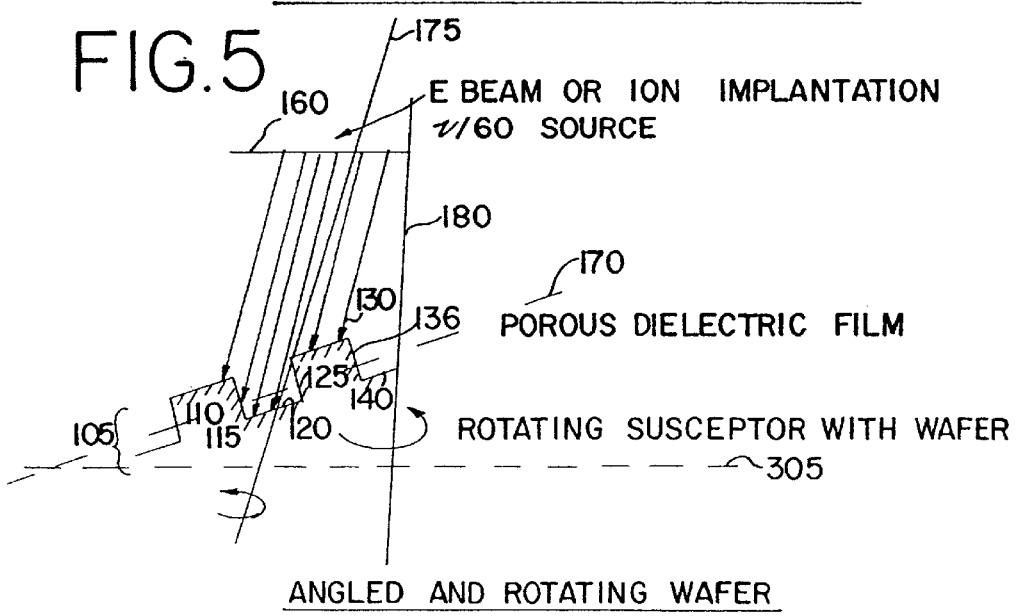

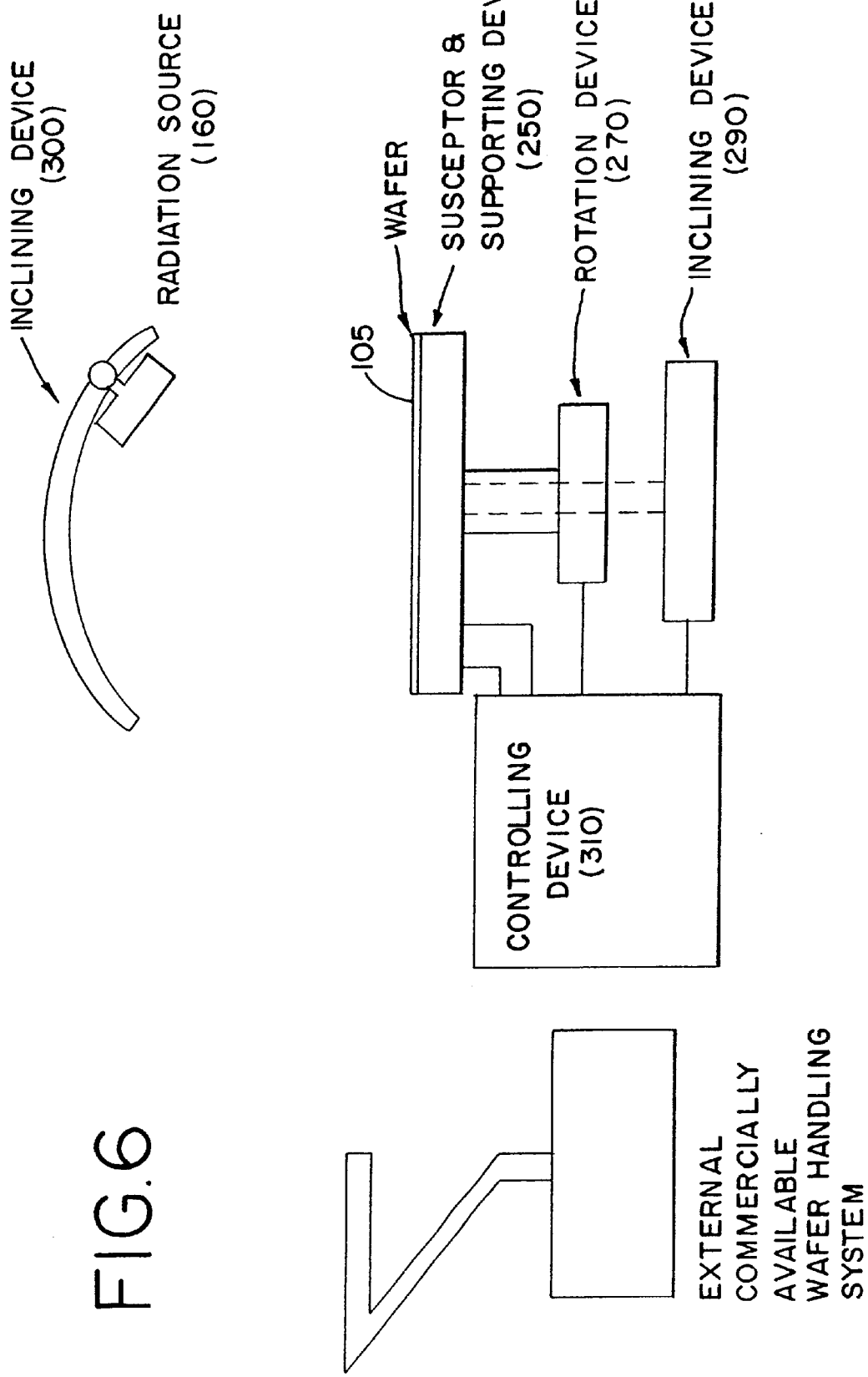

METHOD AND SYSTEM FOR MODIFYING AND DENSIFYING A POROUS FILM

BACKGROUND OF THE INVENTION

1. Technical Field of the Invention

The invention relates to a method and a system for altering the porosity of thin films, and more particularly, to a method and a system for creating a dielectric film having a low dielectric constant.

2. Description of Related Art

Microelectronic circuits perform a variety of functions in small designs. With growing circuit speeds and miniaturization, smaller circuit layouts stacked in a multi-layer structure are susceptible to the parasitic effect of capacitive coupling.

One solution that controls the effect of capacitive coupling employs an interlayer dielectric having a low dielectric constant. The integration of low dielectric constant materials between integrated circuits isolate conductors, reduces power consumption, and lowers the parasitic effect of capacitive coupling.

Several materials can be used as dielectrics. One insulator used in microelectronic circuits is silicon dioxide ($SiO_2$). Silicon dioxide has a dielectric constant of about four. One of the lowest known dielectric materials is air having a dielectric constant of about one. Unfortunately, air does not lend itself to multilayered design as it offers no underlying structure to support layered circuits.

Accordingly, there is a need for a method and a system that can achieve a low dielectric constant and also support multilayered circuits. One class of tunable dielectric constant materials having these properties is xerogels. Xerogels achieve a low dielectric constant through the integration of nanometer size pores within a silicon dioxide film. By applying a well-controlled evaporation process, the xerogels can achieve a tuned dielectric constant by tailoring the size and number of its pores. Xerogels can require strict atmospheric controls to achieve the desired pore size, pore distribution, and dielectric density. Accordingly, the preparation of xerogels can require considerable time.

In light of the above described problems, there is a need for a simple and timely method and system that creates a material having a predetermined dielectric constant that is capable of supporting the feature sizes of integrated circuits and lends itself to a multilayered design.

SUMMARY OF THE INVENTION

The invention provides a system and a method for densifying a surface of a porous film. By reducing the porosity of a film, the method yields a densified film that is more impenetrable to subsequent processes. The method comprises the steps of providing a film having an exposed surface. The film can be supported by a semiconductor substrate. When the film is moved to a processing position, a focused source of radiation is created by a beam source. The exposed surface of the film is then irradiated by the beam source at the processing position until a predetermined dielectric constant is achieved. The film or beam source may be rotated, inclined, and/or moved between a variety of positions to ensure that the exposed surface of the film is irradiated evenly.

Another aspect of this invention involves a system for fabricating a tuned dielectric film. The tuned dielectric fabricating system comprises a radiation source, a positioning device, and a controlling device. The radiation source emits a focused beam of radiation, which for example, may comprise an electron beam or ion implantation beam. The positioning device places the film at a location that can receive the focused beam of radiation. Preferably, the positioning device and radiation source are coupled to rotating and inclining devices. The controlling device can manipulate the radiation source, the positioning device, the rotating devices, and/or the inclining devices such that the focused beam of radiation irradiates the film until a predetermined dielectric constant is attained.

The radiation source may be rotated, inclined, and/or moved and may comprise a plurality of sources of radiation. The sources of radiation may irradiate select areas of the film from different positions to ensure even coverage. For example, where trenches are formed in the dielectric film, the plurality of radiation sources, which may be rotated, inclined, and/or positioned apart, will irradiate the sides and bottom of the trench uniformly. Adjacent surfaces can also be irradiated as can more than one trench.

BRIEF DESCRIPTION OF THE DRAWINGS

FIG. 3 is a cross-sectional view of a film being prepared according to a first embodiment of the invention;

FIG. 4 is a cross-sectional view of a film being prepared according to a second embodiment of the invention;

FIG. 5 is a cross-sectional view of a film being prepared according to a third embodiment of the invention; and FIG. 6 is a block diagram of a system in accordance with the invention for implementing the embodiments of FIGS. 3–5.

In the drawings, depicted elements are not necessarily drawn to scale and the same reference numbers through several views may designate alike and similar elements.

DETAILED DESCRIPTION OF THE PRESENTLY PREFERRED EMBODIMENTS

Figure 1:
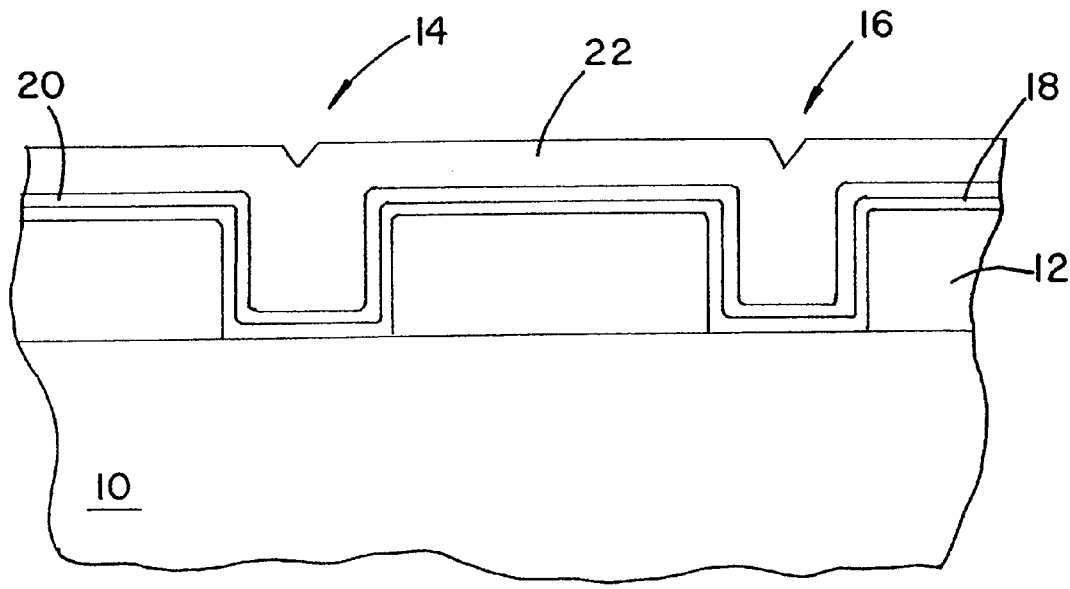
FIG. 1 is a cross-sectional view of a semiconductor substrate having a porous dielectric layer thereon.
Figure 2:
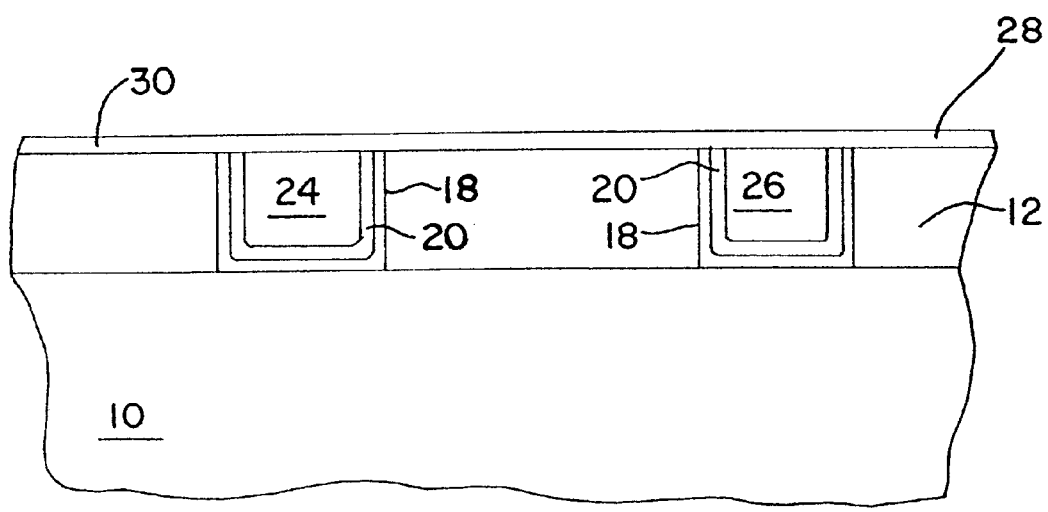
FIG. 2 is a cross-sectional view of a semiconductor substrate having in-laid copper leads formed in the porous dielectric layer shown in FIG. 1.

The advantages of the present invention can be readily comprehended through a description of a process for fabricating in-laid copper leads in a dielectric film. Shown in FIG. 1, in cross-section, is a portion of a semiconductor substrate 10 having a dielectric layer 12 overlying the surface of semiconductor substrate 10. Dielectric layer 12 is a silicon dioxide material formed using the xerogel process previously described. To accommodate in-laid copper leads, dielectric layer 12 includes a first trench 14 and a second trench 16.

To form first and second trenches 14 and 16 in dielectric layer 12, a plasma etching process is preferably carried out that preferentially etches silicon dioxide, while not substantially etching other materials, such as single silicon and polycrystalline silicon, and the like. It is often necessary to apply a wet cleaning process to remove polymer etching residue overlying the surface areas of dielectric layer 12. Preferably, after completing the plasma etching process, an organic cleaning solution is applied to remove polymer fragments from the surface of dielectric layer 12.

To prevent the diffusion of copper into semiconductor substrate 10, a barrier layer 18 is deposited to overlie the upper surface of dielectric layer 12. Barrier layer 18 is preferably a tantalum (Ta) metal film, or alternatively, a metal nitride, such as tantalum nitride (TaN), titanium nitride (TiN), tungsten nitride (WN), and the like. Preferably, barrier layer 18 is deposited by a physical-vapor-deposition (PVD) or by a plasma-enhanced-chemical-vapor-(PECVD) deposition process to a thickness of about 300 angstroms.

After forming barrier layer 18, a copper seed layer 20 is deposited to overlie barrier layer 18. Copper seed layer 20 provides electroplating imitation sites for the subsequent formation of a copper layer overlying semiconductor substrate 10. Preferably, copper seed layer 20 is 2000 Å formed by a PVD or PECVD of copper.

Once copper seed layer 20 is formed, a copper electroplate deposition process is carried out to form a copper layer 22 overlying semiconductor substrate 10. During the deposition process, copper selectively deposits on the copper seed layer 20. As the deposition process continues, successive layers of copper are deposited and eventually fill first and second trenches 14 and 16, and cover the remaining surfaces of semiconductor substrate 10.

After forming copper layer 22, a planarization process is carried out to form in-laid copper leads 24 and 26 in first and second trenches 14 and 16, respectively. Preferably, a non-selective planarization process, such as chemical-mechanical-polishing (CMP) is used to form a planar surface 28. Alternatively, a non-selective plasma etching process can also be used. The non-selective planarization process removes substantially all layers overlying the upper surface of dielectric layer 12. Also, depending upon the polishing resistance or etching resistance of dielectric layer 12, a surface portion of dielectric layer 12 can also be removed during the planarization process. Once completed, in-laid copper leads 24 and 26 are defined by the shape of first and second trenches 14 and 16, respectively. In-laid copper leads 24 and 26 can extend in a variety of directions over the surface of semiconductor 10 in order to electrically interconnect various circuit components commonly used in an integrated circuit device.

Upon completion of the planarization process and the formation of in-laid copper leads 24 and 26, a silicon nitride layer 30 is deposited to overlie planar surface 28. Preferably, silicon nitride layer 30 is deposited using a PECVD process to a thickness of about 500 angstroms. Silicon nitride layer 30 seals the upper surface of in-laid copper leads 24 and 26 to prevent the diffusion of unwanted contaminants, such as oxygen, and the like, into the copper leads. Although the foregoing process is described in the context of the formation of copper leads, those skilled in the art will recognize that other structures, such as metallized vias, and the like, can also be formed using the processing steps described above.

The use of a xerogel to obtain a dielectric film having a low dielectric constant can provide a convenient means for the formation of such a film, however, numerous processing interactions can function to increase the dielectric constant of a xerogel. Although xerogel, as formed, has a dielectric constant in the range of about 1.5 to 2.5, process interactions can increase the dielectric constant to a value similar to thermally deposited silicon dioxide (about 4.0). For example, during the formation of trenches, such as first and second trenches 14 and 16, moisture can be absorbed by the xerogel from the cleaning solution used to remove polymer fragments from the surface of the dielectric layer. Because the dielectric film is porous, solvents, such as water, and the like, in the cleaning solution can be absorbed into the dielectric film. In the case of water this is specially problematic because water has a dielectric constant of about 85.

In addition to the deleterious effects of chemical absorption, metallic atoms from barrier layer 18 can diffuse into the porous xerogel. The diffused elements can react with the carbon in the xerogel and sever the carbon-silicon bonds within the xerogel. Further, nitrogen from silicon nitride layer 30 can diffuse into the xerogel and form silicon nitride and silicon oxynitride. These compounds have dielectric constants ranging from of about 6, to about 7. Thus, while the porosity of the xerogel leads to a beneficial low dielectric constant, the porosity also provides diffusion pathways for the diffusion of unwanted materials into the dielectric film. These materials react with the chemical constituents of the xerogel to form high dielectric constant compounds.

In addition to providing diffusion pathways for chemical species contained in fabrication materials and processing compounds, the porous nature of xerogel renders this material easily removable by planarization processes, such as CMP. Those skilled in the art will appreciate that precise control of the resistivity of in-laid copper leads requires that a specified cross-sectional area be maintained throughout the length of the copper lead. Accordingly, it is undesirable to remove substantial amounts of the dielectric material during the planarization process. In an ideal case, the thickness of the in-laid copper lead will be determined by the deposition thickness of the dielectric layer. If substantial portions of the dielectric layer are removed during the planarization process, or non-uniformly removed, the thickness of the subsequently formed in-laid copper leads will vary at different locations in the integrated circuit device. The accompanying change in resistance can deleteriously affect the function of the integrated circuit.

The process and material induced deleterious effects on the dielectric constant of a dielectric film formed with a xerogel can be reduced by the process and system of the present invention. By controllably reducing the porosity of the dielectric film, the present invention enables the formation of a densified dielectric film that resists the inter-diffusion of fabrication materials and process chemicals, and increases the hardness of the film, such that an improved planarization process can be carried out.

The tunable dielectric process preferably includes a positioning and an irradiating method. The method preferably employs a radiation source 160 and/or a supporting device 250, as shown in FIG. 6. The radiation source 160 and the supporting device 250 can be rotated, inclined, and/or moved. Rotating device 270 and serves as a means for rotating a supporting device 250 such as a susceptor 160. The rotating device 270 can attain a range of rotational rates that allow a film 105 to be irradiated evenly. Exemplary rotation rates can range from 0 to 100 revolutions per mm. Similarly, inclining devices 290 and 300 serve as means for inclining the supporting device 250 and the radiation source 160 separately. Preferably, one of the inclining devices 290 can incline the film 105 to a plurality of inclining angles formed between the supporting device 250 and a level horizontal surface 305 (shown in FIG. 5). A device that rotates and inclines the supporting device 250 and radiation source 160 integrally is envisioned in alternative embodiments.

FIG. 3 illustrates a cross-sectional view of the film 105 being prepared according to an embodiment of the invention. Here, a thin film 105 is being prepared. As shown, the thin film 105 has an exposed surface comprising a plurality of trenches or vias within a plurality of substantially horizontal surfaces. In particular, the thin film 105 comprises first, second, and third substantially plane surfaces 110, 130, and 150, separated by a first 155 trench and a second trench

158. The first trench 155 comprises a first sidewall 115 and a second sidewall 125 connected to a first base wall 120. The second channel 158 comprises a third sidewall 135 and a fourth sidewall 145 connected to a second base wall 140. As workers skilled in the art will appreciate, the shapes of the first and second channels 158 and 260 are not necessarily uniform nor are the channel shapes necessarily rectangular. The characteristics of the trenches and vias may comprise any variety of geometric shapes, such as, for example, a "U" or a "V" shape.

1. First Embodiment

A tunable dielectric comprising the film 105 having a plurality of pores is shown in FIG. 3. Preferably, the film 105, which may be a thin film, is supported by an underlying structure 185, such as a semiconductor substrate with or without underlying process layers. Utilizing a radiation source 160 that can be rotated inclined, and/or moved, one or more electron beams 165 are formed. In a first embodiment, an "Electron Cure 30" manufactured by Allied Signal Incorporated of San Diego, Calif. provides the radiation source 160. The electron beams 165 preferably radiate along one 175 or more beam axes. When the thin film 105 is placed at a processing position 100, the electron beams 165 irradiate one or more select areas of the thin film 105. In FIG. 3, the select areas comprise the second side wall 115 and the second substantially plane surface 130. In these areas 115 and 130, the electron beams 165 preferably form an acute radiating angle between the beam axes 175 and a film axis 170. The observed radiating angle, however, may comprise an angle between zero and one hundred and eighty degrees. Furthermore, although an electron beam 165 is used in the first embodiment, other sources of radiation may be used in alternative embodiments without departing from the spirit or scope of the invention, such as, for example, ion beams.

In the above process, the radiation source 160 and the thin film 105 may be rotated or inclined. FIG. 3 shows the radiation source 160 and the thin film 105 being rotated about the beam axes 175 and rotational axis 180, respectively. As the select areas 115 and 130 are irradiated, the radiation source 160 and the thin film 105 are rotated ensuring an even exposure. Moreover, inclining devices 290 and 300 may adjust the position and slope of the radiation source 160 and the thin film 105. FIG. 5 shows the thin film 105 inclined forming an acute angle between the film axis 170 and a level horizontal surface 305. Preferably, the inclination of the thin film 105 ensures a uniform irradiation of the select areas of the thin film 105. Workers skilled in the art will readily appreciate that the rotation and inclination of the radiation source 160 and/or the thin film 105 can be employed or eliminated for any particular application to attain desired dielectric constants.

The intensity of electron beams 165 and there emitted duration are dependent on the current and desired properties of the thin film 105. Specifically, the chemical composition, the pore distribution, dielectric density, thickness, and desired dielectric constant will determine the intensity and duration of the process. As workers skilled in the art will appreciate, this list is not exhaustive and many other properties can be considered when selecting the intensity of electron beams 165 and this emitted duration. Thus, it should be clear that other present and desired properties of the thin film 105 are considered in alternative embodiments.

2. Second Embodiment

FIG. 4 shows a second embodiment that also reduces the porosity of thin film 105. Only those parts of the second embodiment that are different from the first embodiment will be described. As shown, the exposed surfaces of thin film 105 are irradiated from three distinct sources of radiation 205, 210, and 220. The three sources 205, 210, and 220 that are shown are focused at specific surfaces 110, 115, 120, 125, 130, 135, 140, 145, and 150 that collectively comprise the exposed surface. The second embodiment allows for the rotation of the radiation sources 205, 210, and 220 and the thin film 105 about a plurality of beam axes 225, 230, and 235 and a rotational axis 180, respectively. Moreover, the second embodiment allows the radiation sources 205, 210, and 220 and the thin film 105 to be inclined through a plurality of angles measured between the level horizontal surface 305 (shown in FIG. 5) and the beam axes 225, 230, and 235 and the level horizontal surface and the film axis 170.

3. Third Embodiment

FIG. 5 depicts a modification of the first embodiment as it shows both a single movable radiation source 160 and illustrates the thin film 105 in an inclined and rotating state. As explained above, as the select areas of the thin film 105 are irradiated, the radiation source 160 and the thin film 105 are rotated to ensure even coverage of select areas 110, 115, 120, and 130. Likewise, the radiation source 160 and the thin film 105 may be inclined. Moreover, the rotation and the inclination of the radiation source 160 and the thin film 105 may continuously change, as the exposed surface is irradiated to ensure that the select areas 110, 115, 120, and 130 attain a predetermined dielectric constant.

Porous silica xerogels and aerogels were used as representative dielectric films in the above-described embodiments. However, those skilled in the art will appreciate that the invention envisions the use of other porous materials, such as, for example, materials that have a high thermal stability and a low thermal expansion coefficient or organic porous materials using low energy, low dosage, radiation sources. The disclosed embodiments enjoy utility in any semiconductor fabrication environment.

The concepts and embodiments previously illustrated may be implemented through a tuned dielectric fabricating system comprising a radiation source 160, a commercially available handling system supporting device 250, rotating device 270, inclining devices 290 and 300, and a controlling device 310, as illustrated in FIG. 6. The radiation source 160, emits one or more focused beams of radiation. Preferably, the focused beams may comprise an electron beam or an ion implantation beam. The handling system places water and film 105 with or without underlying process layers. Preferably, the supporting device 250 and the radiation source 160, are coupled to rotating device 270 and inclining devices 290, 300 to rotate and/or incline the thin film 105 and radiation source 160, respectively. The controlling device 310 can manipulate the supporting device 250, rotating devices 270 and 280, and inclining devices 290 and 300 such that the focused source of radiation irradiates the select areas of the film 105 entirely until a desired dielectric constant is attained.

Those skilled in the art will implement the steps necessary to provide the device and methods disclosed. It is understood that the process parameters including the rotational rates, inclining angles, sources of radiation, radiation intensity, and radiation duration are to be selected according to the properties of the film 105 and the desired dielectric constant to be attained.

Variations and modifications of the embodiments disclosed herein may be made without departing from the scope of the invention. The aforementioned description is intended to be illustrative rather than limiting and it is understood that the following claims and all equivalents set forth the scope of the invention.

What is claimed is:

1. A method for fabricating an in-laid metal lead in a semiconductor device comprising the steps of:

providing a semiconductor substrate having a patterned dielectric layer thereon, wherein the dielectric layer has a trench formed therein;

providing an electron beam source;

generating an electron beam; and irradiating the dielectric layer with the electron beam, while rotating the semiconductor substrate about a first rotational axis;

rotating the electron beam source about a second, different rotational axis, while irradiating the dielectric layer; and filling the irradiated trench with a metal layer.

2. The method of claim 1 further comprising:

forming a barrier layer overlying the patterned dielectric layer prior to forming the metal layer; and planarizing the metal layer to form the in-laid metal lead within the trench.

3. The method of claim 2, wherein forming the metal layer comprises forming a copper layer within the trench and overlying the barrier layer.

* * * * *